United States Patent
Roberts, Jr. et al.

(10) Patent No.: US 11,555,856 B2
(45) Date of Patent: Jan. 17, 2023

(54) METHOD FOR IN SITU FUNCTIONALITY TESTING OF SWITCHES AND CONTACTS IN SEMICONDUCTOR INTERFACE HARDWARE

(71) Applicant: CELERINT, LLC, New York, NY (US)

(72) Inventors: Howard H. Roberts, Jr., San Antonio, TX (US); LeRoy Growt, Kyle, TX (US)

(73) Assignee: CELERINT, LLC, New York, NY (US)

( * ) Notice: Subject to any disclaimer, the term of this patent is extended or adjusted under 35 U.S.C. 154(b) by 0 days.

(21) Appl. No.: 17/280,393

(22) PCT Filed: Sep. 25, 2019

(86) PCT No.: PCT/US2019/052953
§ 371 (c)(1),
(2) Date: Mar. 26, 2021

(87) PCT Pub. No.: WO2020/068980
PCT Pub. Date: Apr. 2, 2020

(65) Prior Publication Data
US 2021/0356524 A1   Nov. 18, 2021

Related U.S. Application Data

(60) Provisional application No. 62/738,589, filed on Sep. 28, 2018.

(51) Int. Cl.
*G01R 31/327* (2006.01)
*G01R 31/11* (2006.01)
*G01R 31/28* (2006.01)

(52) U.S. Cl.
CPC .......... *G01R 31/3278* (2013.01); *G01R 31/11* (2013.01); *G01R 31/2889* (2013.01)

(58) Field of Classification Search
CPC ........... G01R 31/3278; G01R 31/2889; G01R 31/11; G01R 35/00; G01R 31/3277
See application file for complete search history.

(56) References Cited

U.S. PATENT DOCUMENTS 3,699,300 A      10/1972   Buerki
6,040,691 A  *    3/2000   Hanners ........... G01R 31/31905
                                                    324/756.07
(Continued)

FOREIGN PATENT DOCUMENTS

WO      2006/102325 A1    9/2006

OTHER PUBLICATIONS

International Search Report, dated Dec. 11, 2019, in International Application No. PCT/US2019/052953.
(Continued)

*Primary Examiner* — Jermele M Hollington
*Assistant Examiner* — Suresh K Rajaputra
(74) *Attorney, Agent, or Firm* — Greenblum & Bernstein, P.L.C.

(57) ABSTRACT

A method is provided for in situ functionality testing of electrical switches using a Functional Reflectometry Test (FRT) of switches on the signal path of electrical circuits in a semiconductor interface. The method includes initiating the functionality testing of the electrical switches in situ, wherein the functionality of the electrical switches is tested while the electrical switches are connected to the Automatic Test Equipment (ATE) and are in-use testing semiconductors. The method also includes conducting full Functional Reflectometry Testing of the electrical switches in situ in an open switch state and a closed switch state to determine
(Continued)

Two Reflection Points whether each of the electrical switches is one of fully functional, stuck closed, and stuck open, wherein testing for each state is performed as a single vector functional test to minimize test time overhead.

17 Claims, 16 Drawing Sheets

(56) References Cited

U.S. PATENT DOCUMENTS

| | | |
|---|---|---|
| 6,703,844 B2 | 3/2004 | Adler et al. |
| 6,998,834 B2 | 2/2006 | Agoston et al. |
| 7,272,767 B2 * | 9/2007 | Colunga ........ G01R 31/318385 714/724 |
| 7,727,767 B2 | 6/2010 | Takenaka |
| 8,299,798 B2 | 10/2012 | Kirsch |
| 2010/0073014 A1 | 3/2010 | Maslen |
| 2017/0038453 A1 * | 2/2017 | Hussey ............ G01R 31/31917 |

OTHER PUBLICATIONS

Written Opinion of the International Searching Authority, dated Dec. 11, 2019, in International Application No. PCT/US2019/052953.

* cited by examiner

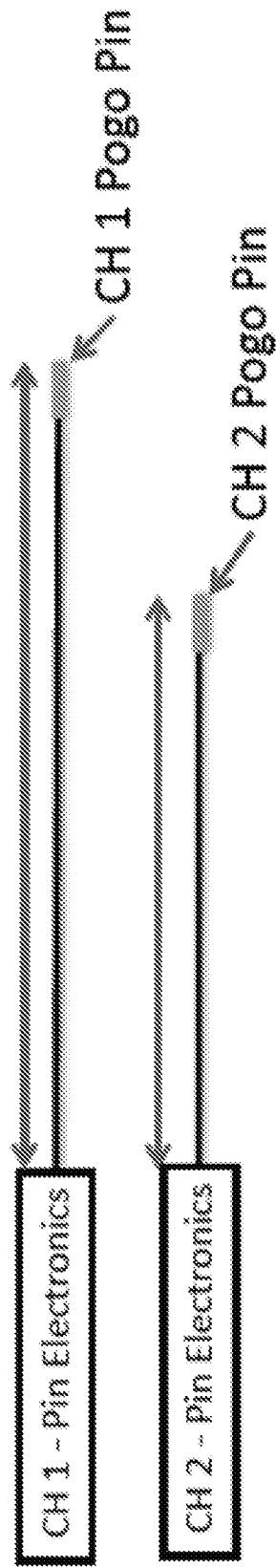
FIG. 1 – Test System TDR Calibration

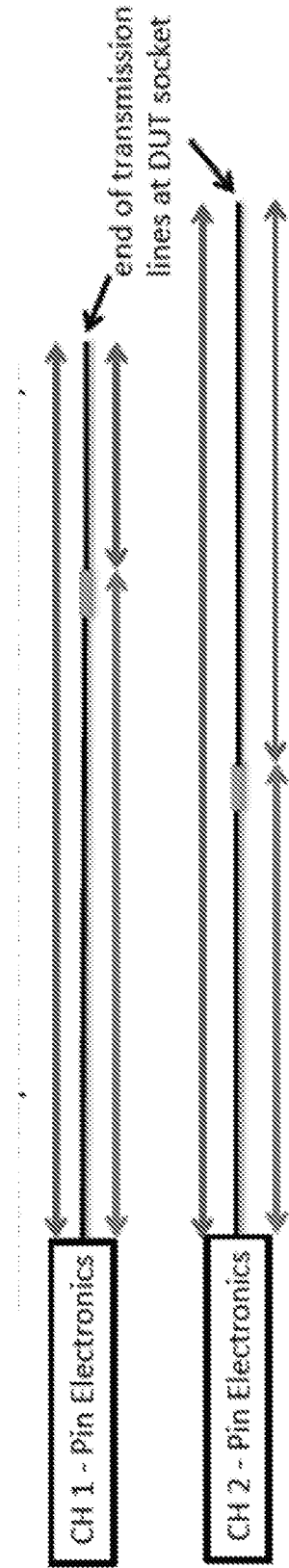
FIG. 2 – Test Fixture TDR Calibration

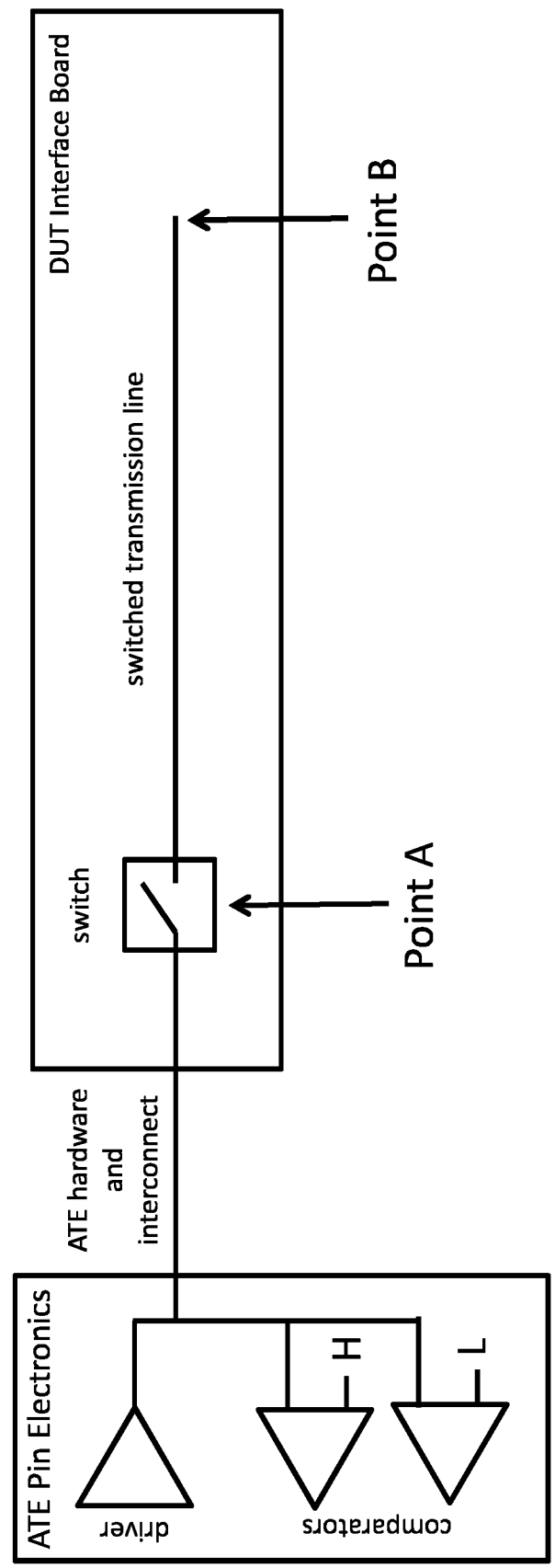
FIG. 3 - Two Reflection Points

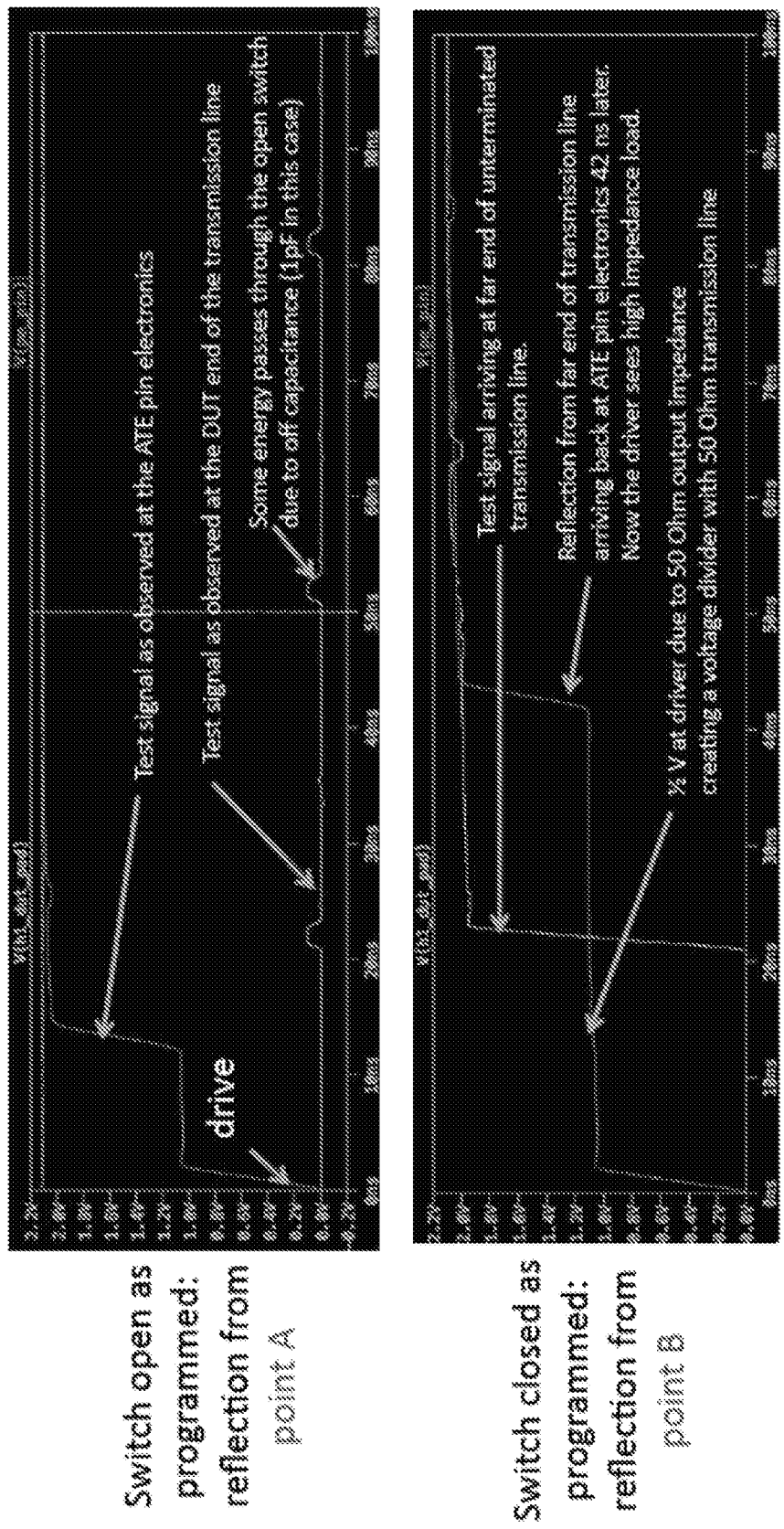
FIG. 4 – Signals on Switched Circuit

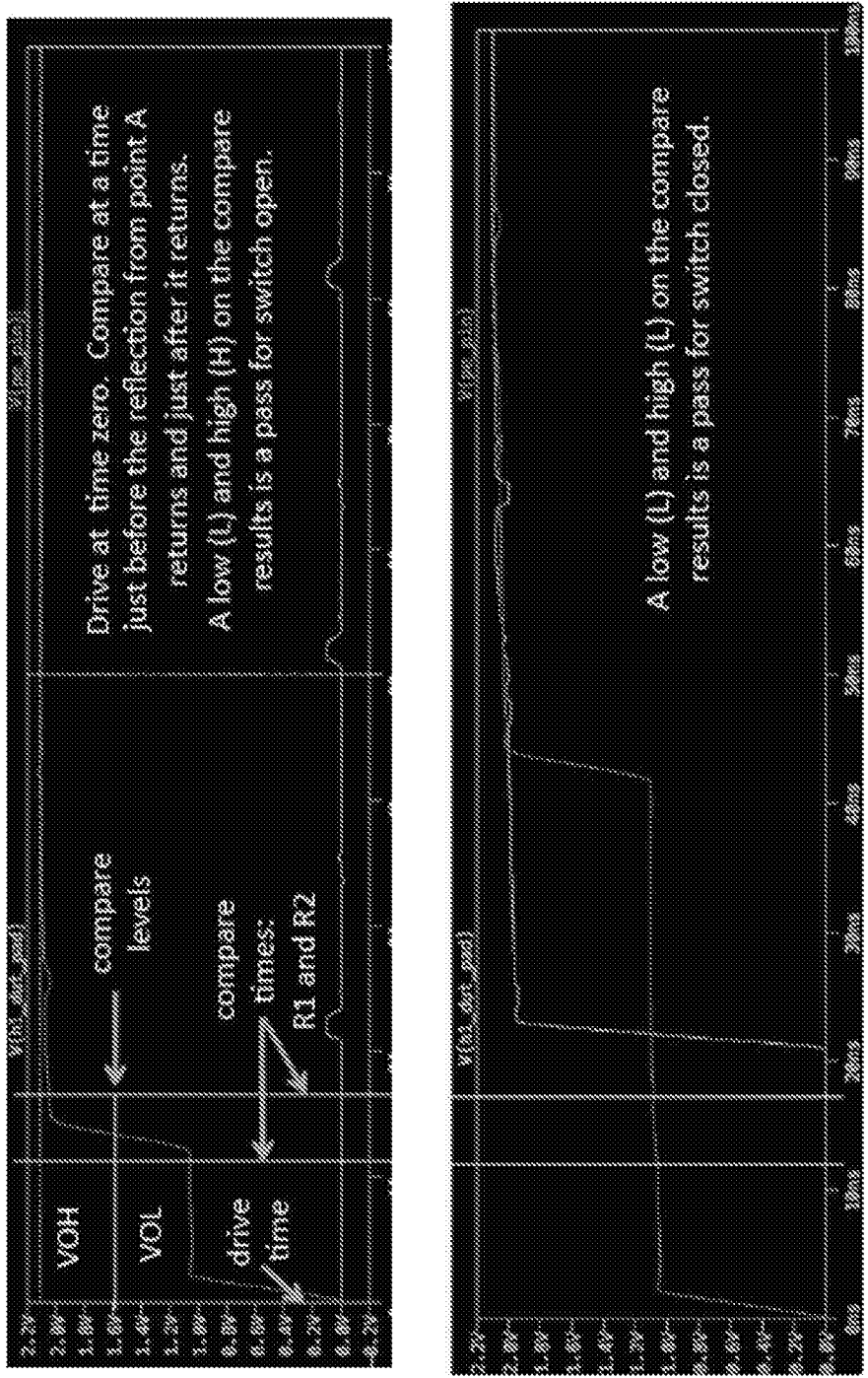
FIG. 5 – Timing And Voltage Levels

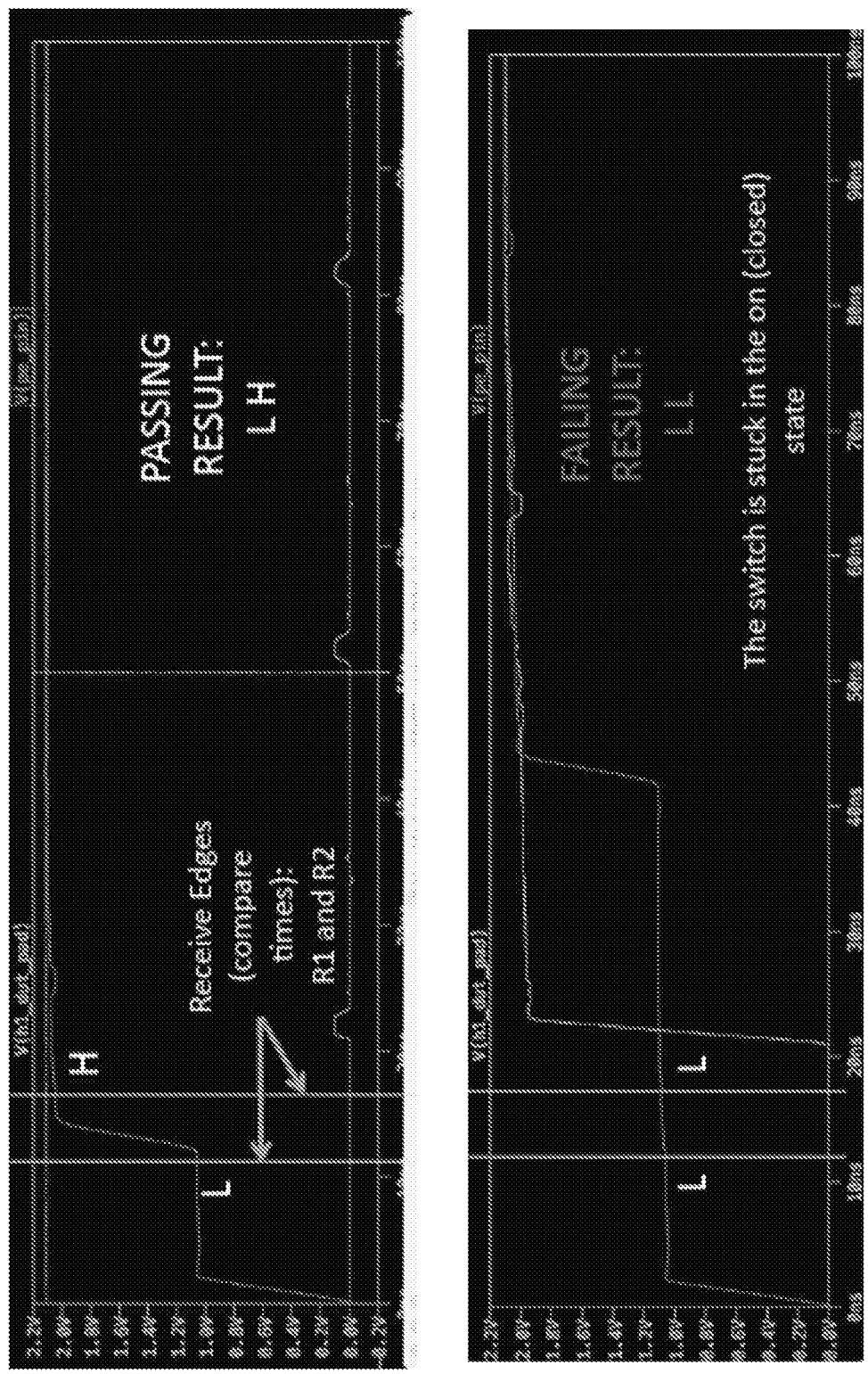
FIG. 6 – Stuck Closed Text

FIG. 7 - Truth Tables

| | R1 | R2 | result |
|---|---|---|---|
| Switch open | L | L | Fail: stuck closed |
| | L | H | Pass |
| | H | L | Error: not possible |
| | H | H | Inconclusive: other open |
| Switch closed | L | L | Pass |
| | L | H | Fail: stuck open |
| | H | L | Error: not possible |
| | H | H | Inconclusive: other open |

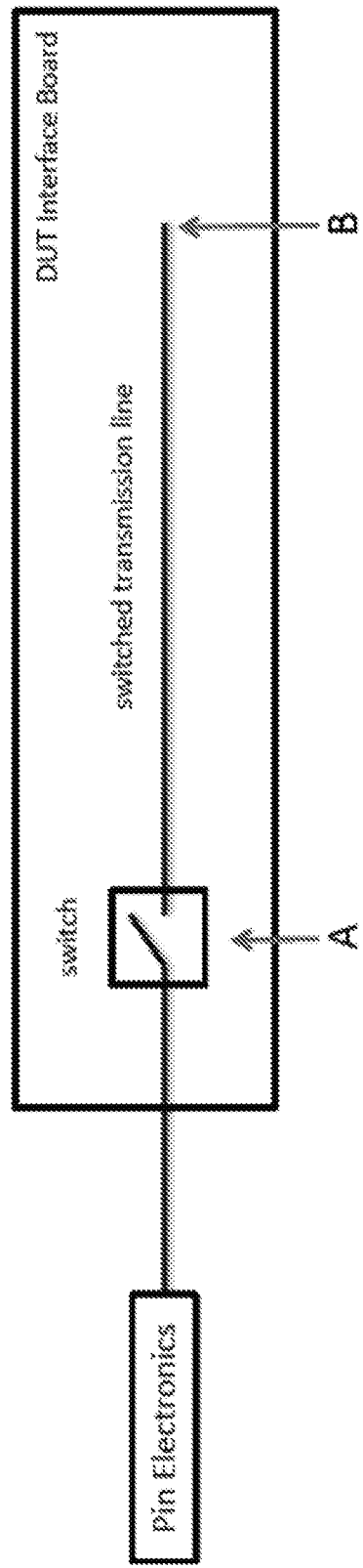
FIG. 8A - Determining Functional Timing

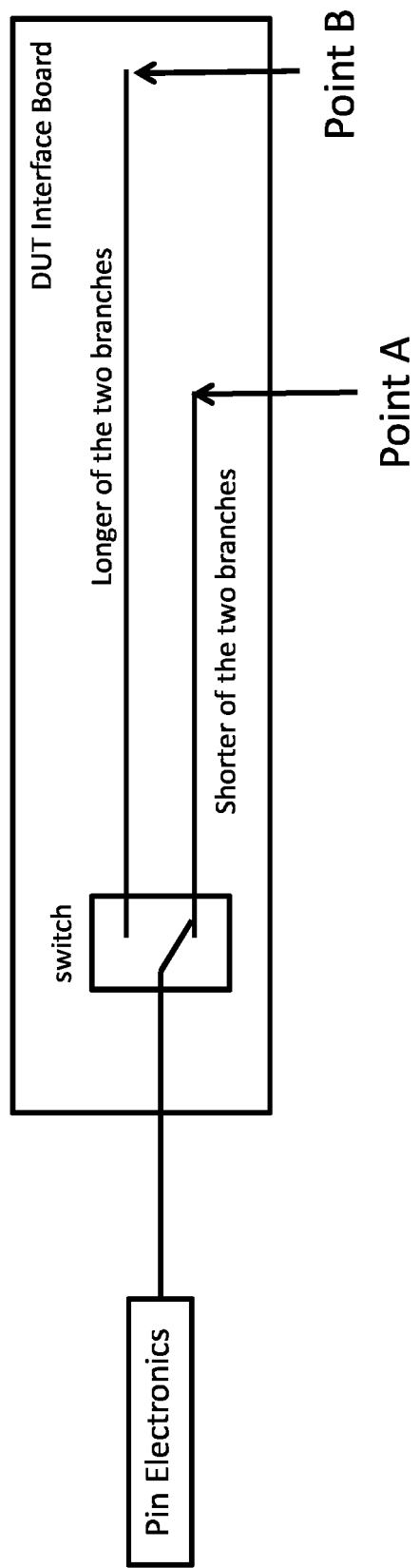
FIG. 8B - Determining Functional Timing

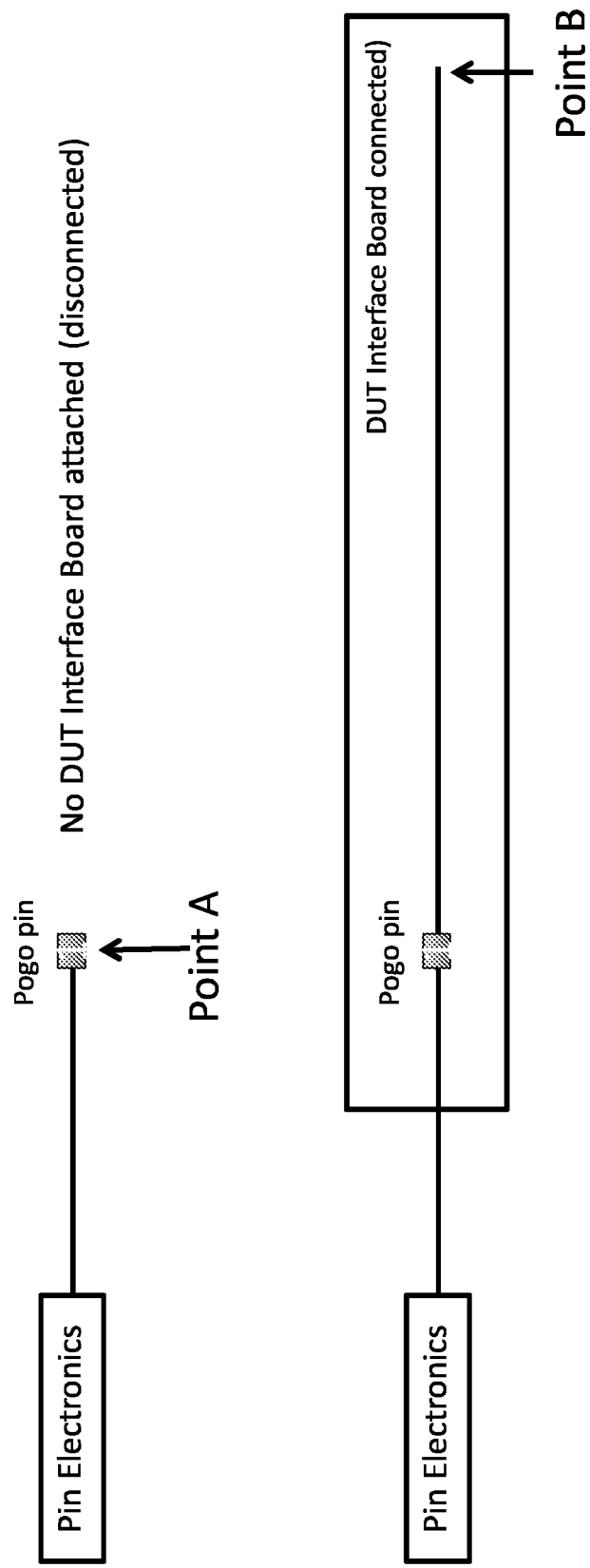
FIG. 8C - Determining Functional Timing

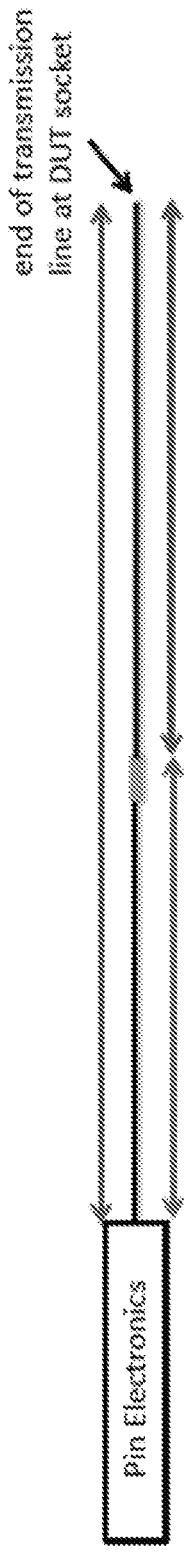
FIG. 8D - Determining Functional Timing
Top Line is the transit time measurement.
Middle Line is transmission at DUT socket.
Bottom Left Line shows the test system TDR calibration delays (T).
Bottom Right Line shows the test fixture TDR calibration delays (B).

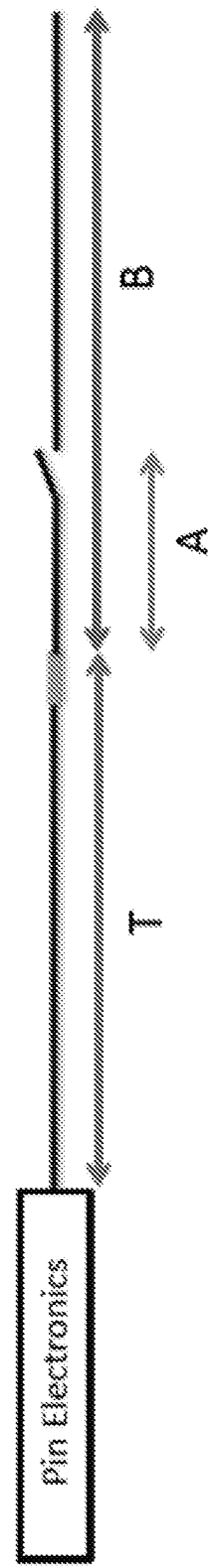
FIG. 8E – Determining Functional Timing

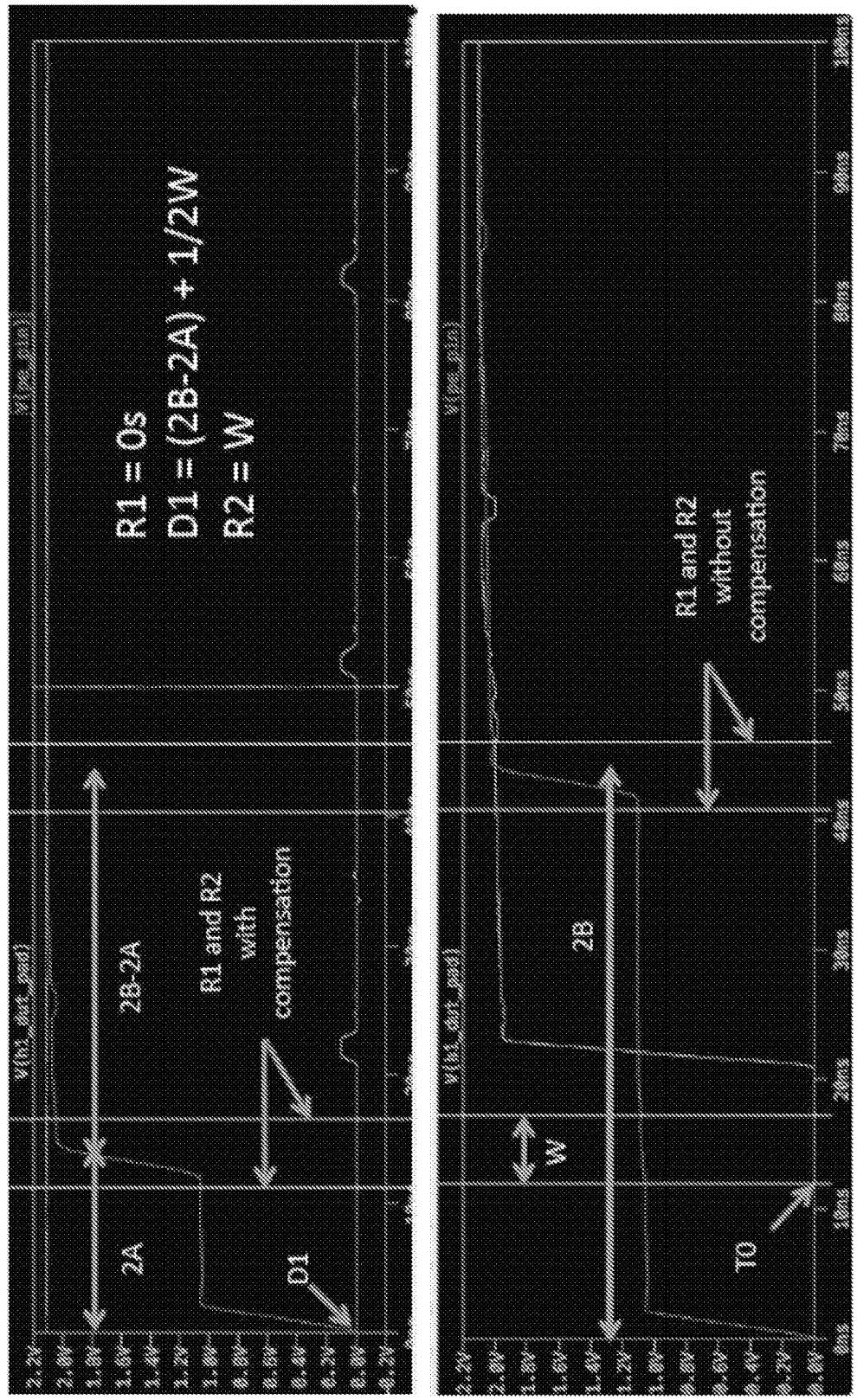
FIG. 8F – Determining Functional Timing

FIG. 9 - Alternative Method

| DUT | Tester TDR Data | Test Fixture TDR Data |
|---|---|---|
| Case 1: Pogo Pins | Normal | All Channels 0s |
| Case 2: Switch/Contact | Normal | Point A TDR Data |
| Case 3: Test Socket (IC Device) | Normal | Point B TDR Data |

METHOD FOR IN SITU FUNCTIONALITY TESTING OF SWITCHES AND CONTACTS IN SEMICONDUCTOR INTERFACE HARDWARE

CROSS-REFERENCE TO RELATED APPLICATION

This application claims the benefit of U.S. Provisional Patent Application No. 62/738,589 entitled "Method for in Situ Functionality of Switches in Semiconductor Interface Hardware," filed on Sep. 28, 2018, the disclosure of which is incorporated by reference herein in its entirety.

TECHNICAL FIELD

The present disclosure is related to automated manufacturer systems and methods, particularly automated semiconductor test equipment. In particular, the present disclosure is directed to a novel method of testing switches and other contacts, i.e., connecting and disconnecting points, on the signal path of electrical interface hardware that are single-pass functional (go/no go), as opposed to current methods that require time intensive iterations or special circuitry that support testing.

BACKGROUND

Manufacturing and production industries use automatic test equipment (ATE) to analyze and assess integrity and operability of manufactured products at various stages of production. Because many diverse types of DUTs are tested by ATEs, and DUTs may be tested at various stages of production (e.g., final test, work piece probe, etc.), ATEs are varied in design according to the particular purpose, device, and/or product for testing.

Although varied, ATEs include several typical operational units. ATEs and robotic manipulators are widely used, for example, in the production of electronic products, such as analog and digital components, circuits and devices (including semiconductors, integrated circuits, microprocessors, and the like). Because of this prevalence, the typical operational units of ATEs are described.

The ATE includes a system controller, which controls the system and movement of data into and out of the system. The ATE also includes test data and test program storage, pattern memory, system power supplies, direct current reference supply unit, analog current reference supply unit, system clocks and calibration circuits, timing and time set memory, and precision measurement units (which may include digital, analog or mixed signal test resource circuitry). In addition, a test head of the ATE includes pin electronics driver cards providing pin circuitry (such as for comparators, current loads and other test resources) for pin electronics testing of DUTs. A device interface board (DIB) (also referred to as "load board) connects to the test head and provides connection socket(s) for the DUT or DUTs, as applicable. The ATE also includes external interfaces for connection to robotic manipulators for test devices (referred to as "handlers" or "device handlers"), as well as interfaces to computers, networks, and/or other instruments, devices or components.

When signal switches, such as electromechanical relays or solid state relays, are added to the signal path of an electrical test circuit, the signal switches introduce the possibility of false results, particularly when they fail. Functional failure modes for malfunctioning switches include, but are not limited to, "stuck closed" and "stuck open." In both cases, the signal switch fails to respond to the control input and change its state.

There are many configurations of switches, but for the purposes of this description the simplest form of switch is used for illustration, which is a single-pole-single-throw (SPST) switch. This switch has two states: (1) the input is disconnected from the output, and (2) the input is connected to the output For the purposes of this description, the application of the switch is a semiconductor test. There are many methods used to test for switch functionality. These methods include, but are not limited to:

(1) Manual: This method activates and deactivates the switch while probing across the output terminals with a multi-meter measuring for alternating shorts and open circuits. The main problem with this method is that it is very time-consuming.

(2) Automated Test Equipment, while not testing a device, using loopback method: This method uses a feedback loop to drive a test signal through the switch while measuring the signal on the loop back circuit. The method also requires two ATE channel resources. If the feedback loop is not used for testing the semiconductor device, then the feedback loop must be switched in as needed. This switching adds complexity and additional cost, and may, under certain conditions, create signal integrity issues (stubs). The problem with this method is that it adds hardware complexity and additional costs.

(3) Automated Test Equipment while not testing a device using force voltage measure current: In this method, if there is a resistive load on the far side of the transmission line, then force a voltage and measure the current. If the current value is what is expected for the load and is near zero when disconnected, the switch is functional. This is a type of loopback with ground as the return point of the circuit. The problem with this method is that resistive loads are not always present.

(4) Automated Test Equipment while testing a device: In this method, a test passes while using a switch for that test. The switch may also be deactivated and the test executed again. A failing result indicates that the switch is functional. The problem in this method is that the method is time consuming and is very application specific.

(5) Iterative functional measurements that use a 2-D Schmoo Method (voltage versus time) to composite a time domain profile of a Time Domain Reflectometry (TDR) pulse as "observed" at the comparators of the pin electronics. This method is used in Time Domain Reflectometry calibration of the test system, by finding the point in time when the reflected voltage pulse returns to the pin electronics. The problem with this method is that the method is very time consuming and prohibitive during device testing in production. Typically, each function pattern is tested by comparing the difference in edge time, which the difference between the edge time when the related relay is closed when compared to the edge time when the related relay is open. This method is very time consuming because the 2D Schmoo Method normally requires 2500 or more functional patterns to be executed.

In Test System TDR Calibration, illustrated in FIG. 1, compression pogo pins electrically connect the tester resources to the device under test and any interposing interface hardware. The pin electronics launch a voltage pulse that is reflected off the unterminated end of the pogo pin and returns to the pin electronics. This round trip time is measured using the 2-D Schmoo method (voltage over time)

to locate the returning edge of the reflected pulse. Half of this value gives the transit time between the pin electronics and the pogo pin. The top lines with the double headed arrows in FIG. 1 represent transit time measurements (not a job TDR).

This data is used to "de-skew" the digital timing. The effect is to calibrate out differences in transit times. It also calibrates out the all timing delays between the pin electronics and the pogo pins. When the software program launches a voltage edge, the actual T0 of the edge when it arrives at the pogo pin. The result is that signals are launched at different times so that they arrive at the pogo pins at the same time. All signals then have the same T0 alignment. The programmer does not need to worry about synchronizing signals. It is done automatically based on the TDR calibration data.

The same de-skew is used for the returning signals. The system knows that all signals reflect off the pogo pins at the same time, so the system adjusts the time when the signals are measured so that differences in return transit times are calibrated out.

In Test Fixture TDR Calibration, illustrated in FIG. 2, the pin electronics launch a voltage pulse. The pulse is reflected off the unterminated end of transmission line and returned to the pin electronics. This round trip time is measured using the 2-D Schmoo method (voltage over time) to locate the returning edge of the reflected pulse. Half of this value gives the transit time between the pin electronics and the test socket (where the line terminates). The top lines with the double headed arrows in FIG. 2 represent transit time measurements (not a job TDR). The bottom lines with the double headed arrows on the left side of the figure represent test system TDR calibration delays. The bottom line with the double head arrows on the right side of the figure represent test fixture TDR calibration delays.

This data is used to "de-skew" the digital timing. The effect is to calibrate out differences in transit times. It also calibrates out the all timing delays between the pin electronics and the test socket. When the software program launches a voltage edge, the actual T0 of the signal is when it arrives at the test socket. The result is that signals are launched at different times so that they arrive at the test socket at the same time. All signals then have the same T0 alignment. The programmer does not need to worry about synchronizing signals. It is done automatically based on the TDR calibration data.

The same de-skew is used for the returning signals. The system knows that all synchronized signals from the DUT are launched at the same time, so the system adjusts the time when the signals are measured so that differences in return transit times are calibrated out. The result is that the arriving signals are all sampled at the same times relative to their synchronized reference but at different absolute times. T0 for the returning signals is then the same for all signals AND the launch T0,

SUMMARY

As discussed above, the conventional methods for the testing of switches and other contacts, i.e., connecting and disconnecting points, on the signal path of semiconductor interface hardware that are single-pass functional (go/no go) either require time intensive iterations or costly special circuitry that support the testing. Thus, the present invention provides for an efficient and effective methodology of "In Situ" functionality testing of switches and other connect/disconnect points on the signal path of electrical semiconductor interface hardware that is single-pass functional (go/no go).

Testing switches and other electrical connect/disconnect points "in situ" on the signal path in the signal path of electrical semiconductor interface hardware means "testing in place". In the context of semiconductor test, "in situ" means testing switch functionality while the switching hardware is connected to the ATE and while in use testing semiconductors. This methodology means that the hardware does not have to be disconnected from the ATE (interrupting the semiconductor testing process) and moved to a specialized test setup. This methodology also means that the switches can be tested at any time by a subroutine of the same program that is testing the semiconductor devices.

Thus, the inventive "in situ" methodology can be implemented using existing ATE resources. The "in situ" methodology can also be configured in a software embodiment without requirement additional hardware. The "in situ" methodology permits the full functional testing of switches, and other electrical connect/disconnect points (such as connectors, pogo pins, cables, etc.), including testing in the open state, the closed state, and the stuck state. For each state, the "in situ" testing can be implemented as a single vector functional test to minimize test time overhead.

In an embodiment, a method is provided for in situ functionality testing of electrical switches using a Functional Reflectometry Test (FRT) of switches on the signal path of electrical circuits in a semiconductor interface. The method comprises initiating the functionality testing of the electrical switches in situ, wherein the functionality of the electrical switches is tested while the electrical switches are connected to the Automatic Test Equipment (ATE) and are in-use testing semiconductors. The method also includes conducting full Functional Reflectometry Testing of the electrical switches in situ in an open switch state and a closed switch state to determine whether each of the electrical switches is one of fully functional, stuck closed, and stuck open, wherein testing for each state is performed as a single vector functional test to minimize test time overhead.

In another embodiment, the test can be executed on every test channel concurrently.

In a further embodiment, the in situ functionality testing includes connect/disconnect points, In an embodiment, the in situ functionality testing includes pogo pins.

In another embodiment, the in situ functionality testing includes semiconductor test sockets.

In a further embodiment, the method uses the Automatic Test Equipment's Time Domain Reflectometry (TDR) calibration program to calibrate out differences in transit times.

In an embodiment, the Functional Reflectometry Test (FRT) creates a timing window within which a reflected edge of a test signal must occur for verification of an open switch state.

In another embodiment, once the open switch state is verified, then timing data used for the verification of the open switch state is used to verify the closed switch state.

In a further embodiment, the Functional Reflectometry Test (FRT) looks for expected reflections of test signals at two points in time.

In an embodiment, the Functional Reflectometry Test is performed every test cycle.

In another embodiment, the total test time for the single vector functional test is less than 10 ms.

In a further embodiment, the method further includes replacing defective electrical switches.

In an embodiment, a system is provided for performing in situ functionality testing of electrical switches using a Functional Reflectometry Test (FRT). The system includes electrical switches located on the signal path of electrical circuits in a semiconductor interface, and a user interface to output test results of the Functional Reflectometry Test (FRT) in a binary pass or fail format. The system also includes Automatic Test Equipment, including one or more processors and one or more memories, connected to the electrical switches, wherein the one or more processors execute instructions that perform operations, including initiating the functionality testing of the electrical switches in situ, wherein the functionality of the electrical switches is tested while the electrical switches are connected to the Automatic Test Equipment (ATE) and are in-use testing semiconductors. The operations performed also include conducting full Functional Reflectometry Testing of the electrical switches in situ in an open switch state and a closed switch state to determine whether each of the electrical switches is one of fully functional, stuck closed, and stuck open, wherein the open switch state and the closed switch state are each performed as a single vector functional test to minimize test time overhead.

In another embodiment of the system, the operations include executing the Automatic Test Equipment's Time Domain Reflectometry (TDR) calibration program to calibrate out differences in transit times.

In a further embodiment of the system, the Functional Reflectometry Test (FRT) creates a timing window within which a reflected edge of a test signal must occur for verification of an open switch state.

In an embodiment of the system, once the open switch state is verified, then timing data used for the verification of the open switch state is used to verify the closed switch state.

In another embodiment of the system, the test can be executed on every test channel concurrently.

In a further embodiment of the system, the in situ functionality testing includes connect/disconnect points.

In an embodiment of the system, the in situ functionality testing includes pogo pins.

In another embodiment, a non-transitory computer-readable storage medium is provided that stores one or more computer programs, which when executed by the computer, cause the computer to execute operations. The operations include initiating the functionality testing of the electrical switches in situ, wherein the functionality of the electrical switches is tested while the electrical switches are connected to the Automatic Test Equipment (ATE) and are in-use testing semiconductors. The operations also include conducting full Functional Reflectometry Testing of the electrical switches in situ in an open switch state and a closed switch state to determine whether each of the electrical switches is one of fully functional, stuck closed, and stuck open, wherein testing for each state is performed as a single vector functional test to minimize test time overhead.

BRIEF DESCRIPTION OF THE DRAWINGS

FIG. 1 provides an illustration of Test System TDR Calibration;

FIG. 2 provides an illustration of Test Fixture TDR Calibration;

FIG. 3 illustrates two reflection points using a single pole, single throw switch;

FIG. 4 illustrates differences in the test signal waveforms reflecting from Points A and B;

FIG. 5 illustrates timing and voltage levels based on a signals reflecting off Points A and B;

FIG. 6 shows an illustration of a Passing Result of a Stuck Closed Test;

FIG. 7 show a Truth Table;

FIGS. 8A-8F illustrate how to determine functional timing;

FIG. 9 shows an Alternative Method for Determining R1, R2, and D1 or three different DUTs;

DETAILED DESCRIPTION

Figure 10:
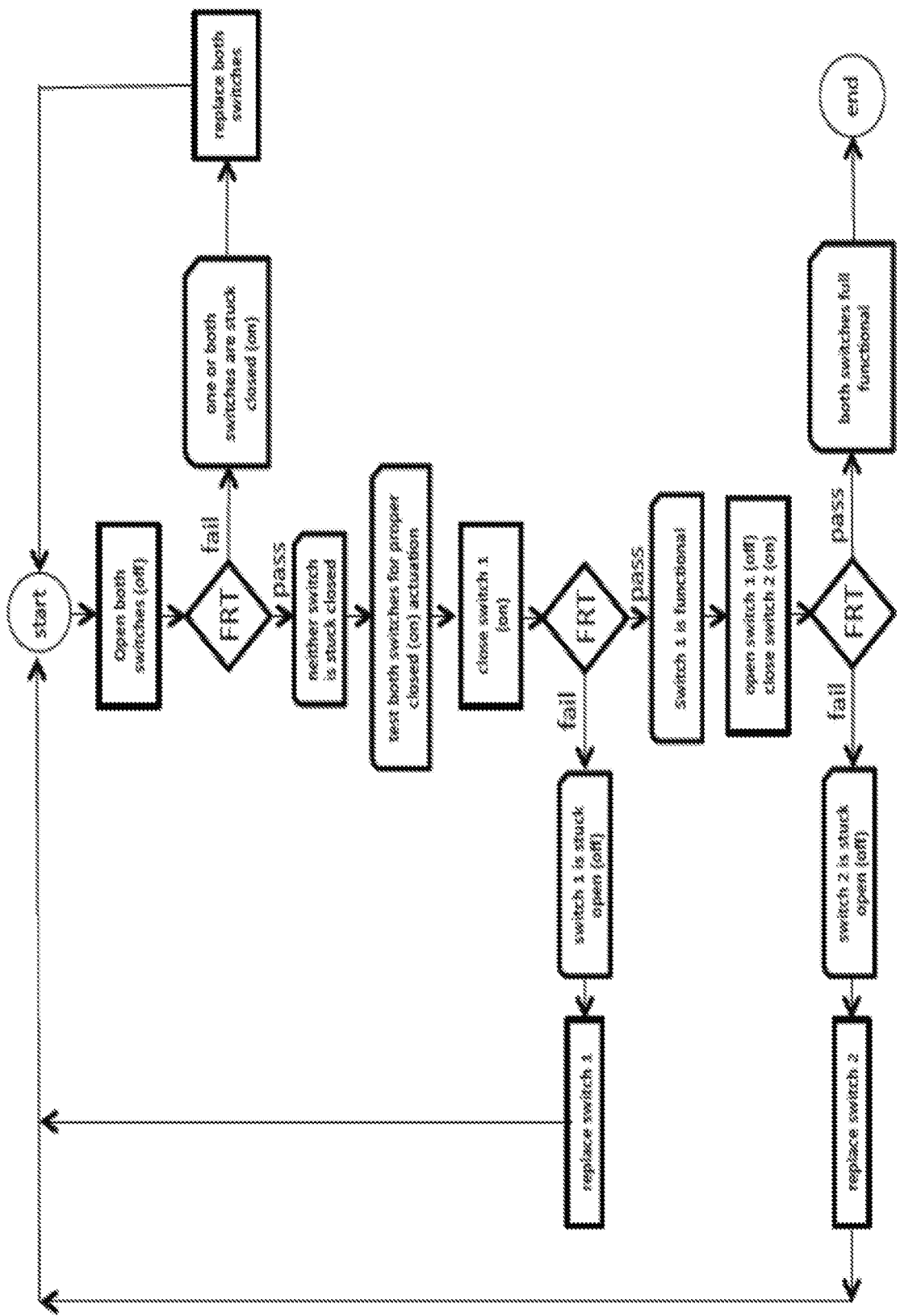
FIG. 10 provides a flowchart of a testing protocol using a Functional Reflectometry Test.

In view of the foregoing, the present disclosure, through one or more of its various aspects, embodiments and/or specific features or sub-components, is thus intended to bring out one or more of the advantages as specifically noted below.

During the description of the invention, a number of acronyms will be used. Thus, the following Glossary provides definitions of notable acronyms:
ATE: Automatic Test Equipment
DUT: Device Under Test, which is undergoing testing
DIB: Device Interface Board (also known as a "load board")
SPST: single-pole-single-throw
TDR: Time Domain Reflectometry
FRT: Functional Reflectometry Test A Functional Reflectometry Test (FRT) is an efficient and effective methodology of "In Situ" functionality testing of switches and other connect/disconnect points on the signal path of electrical semiconductor interface hardware that is single-pass functional (go/no go). The FRT test methodology uses the standard ATE pin electronics in a novel way, and is so fast that the FRT test methodology can be executed during every test cycle with no significant penalty in throughput.

The FRT method is not TDR calibration that uses the iterative 2-D Schmoo method to measure the time when a TDR pulse edge returns to the pin electronics point of origin. The FRT method is also not a digital waveform tool that uses the iterative 2.0 Schmoo method to composite the time domain profile. In contrast, the FRT method is a single vector functional test.

FIG. 3 illustrates the use of two reflection points, i.e., Point A and Point B. For the purposes of illustration, the simplest configuration of a switch will be used, which is a single pole, single throw (SPST) switch. This model applies to any point of connect/disconnect functionality, such as cables, connectors, or pogo pin connectors. A reflection will return to the ATE pin electronics from either Point A, when the switch is open, or from Point B, when the switch is closed.

FIG. 4 illustrates differences in the test signal waveforms based on a signal reflecting from Point A where the switch is open as programmed and a signal reflecting from Point B where the switch is closed as programmed. (Refer to Point A and Point B in FIG. 3.) When the switch is open, the test signal reflected from Point A is illustrated as observed at the ATE pin electronics, and as observed at the DUT end of the transmission line. Note that some energy passes through the open switch due to off capacitance. When the switch is closed, the test signal arriving at the far end of the unterminated transmission line is illustrated. The test signal reflection from the far end of the transmission line arriving back at the ATE pin electronics is also illustrated. Note that ½ of the voltage level at the driver is observed due to output impedance creating a voltage divider with the transmission line.

FIG. 5 illustrates a comparison of timing and voltage levels based on a signal reflecting from Point A when the switch is open as programmed, and based on a signal reflecting from Point B with the switch is closed as programmed.

FIG. 6 shows an illustration of a Passing Result of a Stuck Closed Test, when the received edges are characterized by a low voltage level followed by a high voltage level. FIG. 6 also shows an illustration of a Failing Result of a Stuck Closed Test, when the received edges are characterized by a low voltage level followed by a high voltage level. In this instance, the switch is stuck in the on (closed) state.

FIG. 7. shows a Truth Table illustrating the test result dependent upon the signal voltage levels at two sequential different times R1 and R2 dependent upon whether the switch is open or closed. As shown in the Truth Table, a sequential result of a low signal voltage followed by a low signal voltage is a test failure by indicating that the switch is stuck open when the switch is open. However, the same a sequential result of a low signal voltage followed by a low signal voltage is a test pass by indicating that the switch is closed when the switch is supposed to be closed. Other possible test results are shown s being inconclusive or not possible.

FIGS. 8A-8F illustrate how to determine functional timing. Referring to FIG. 8A, the Functional Reflectometry Test Protocol for a single pole, single throw switch begins with using the Time Domain Reflectometry (TDR) calibration program of the ATE to get data to calculate R1, R2, and D1, where R1 and R2 represent the voltage levels at two different sequential points in time, and D1 represents the time interval between R1 and R2. In this single pole, single throw switch configuration, Point A is located at the switch, wherein Point B is located at the end of the switched transmission line.

With all switches open (disconnected), then a TDR calibration is run on channels with open switches. This returns test fixture TDR calibration delays for point A. All point A data is then stored. The switches are then closed (connected) and TDR test fixture calibration is run as normal. This returns test fixture TDR calibration delays for point B. Then all Point B data is stored. At this time, Point B data is used to TDR calibrate the ATE as normal.

FIG. 8B illustrates a similar Functional Reflectometry Test Protocol for a single pole, double throw switch by using the new Point A and Point B locations shown in FIG. 8B. In this single pole, double throw switch configuration, Point A is located at the end of the shorter of the two branch circuits, wherein Point B is located at the end of the longer of the two branch circuits.

Then, the method follows the same operations discussed above relating to FIG. 8A. With all switches open (disconnected), a TDR calibration is run on channels with open switches. This returns test fixture TDR calibration delays for point A. All point A data is then stored. The switches are then closed (connected) and TDR test fixture calibration is run as normal. This returns test fixture TDR calibration delays for point B. Then all Point B data is stored. At this time, Point B data is used to TDR calibrate the ATE as normal.

FIG. 8C illustrates a similar for generic connect and disconnect points, such as pogo pins. In FIG. 8C, Point A is located at a pogo pin at the end of a circuit connected to PIN electronics without a DUT Interface Board attached (disconnected). Point B is located at the end of the circuit, connected to Pin electronics, that includes the pogo pin with the DUT Interface Board connected.

Then, the method follows the same operations discussed above relating to FIG. 8A and FIG. 8B. With all switches open (disconnected), a TDR calibration is run on channels with open switches. This returns test fixture TDR calibration delays for point A. All point A data is then stored. The switches are then closed (connected) and TDR test fixture calibration is run as normal. This returns test fixture TDR calibration delays for point B. Then all Point B data is stored. At this time, Point B data is used to TDR calibrate the ATE as normal.

As shown in FIG. 8D, the Protocol continues. In FIG. 8D, the top line with the double headed arrows represents the transit time measurement between the Pin electronics and the end of the transmission line at a DUT socket. The middle line illustrate an end of transmission line at a DUT socket. The bottom left line with the double headed arrows represents that TDR calibration delays (T), whereas the bottom right line with the double headed arrows represents the text fixture TDR calibration delays (B).

R1 and R2 are the compare times for the two checks on the reflected signal. R1 must be before the reflection arrives, and R2 must be just after the reflection arrives. R1 and R2 create a "timing window" within which the reflected edge must occur for verification of an open switch state. Once the open state is verified, the same values can then be used to verify the closed state. If R1, R2, and D1 are all set to the same time for the Functional Reflectometry Test, the receive edges will occur at a delayed time equal to the entire round trip transit time between the Pin electronics and Point B. This is equal to two times the transit time measurements in FIG. 8D. It is also equal to two times the sum of the Test System TDR calibration delays (T) and the Test Fixture TDR calibration delays (B) or 2(T+B).

In FIG. 8E, if R1, R2, and D1 are all set to the same time for the Functional Reflectometry Test, the compare times will be late because the reflection from the open switch arrived earlier. To align the drive and receive edges, the compare times must be reduced (made to occur earlier) by reducing 2(T+B) to 2(T+A). This can be expressed as 2(T+B)−2(T+A)=2T+2B−2T−2A=2B−2A.

The compare times must occur (2B−2A) before the drive edge for them to be aligned when the reflection returns from the open switch. This can be implemented by placing the strobes at T0 and delaying the drive edge by (2B−2A).

Of course, there needs to be a compare window around the reflected edge, so the R2 must be delayed from R1 by the window width (W).

To place the reflected edge in the center of the window, the drive edge should be delayed by ½ W.

These two timings shown below are equivalent, however, they have different T0 references. Thus, the LEFT TIMING is all positive timing and is better suited for semiconductor test programming.

| [LEFT TIMING] | [RIGHT TIMING] |
|---|---|
| R1 = 0 s = T0 | R1 = −((2B − 2A) + ½ W)) |
| D1 = (2B − 2A) + ½ W | D1 = 0 s = T0 |
| R2 = W | R2 = −((2B − 2A) + ½ W)) + W |

FIG. 8F provides a graphical illustration of these two timings, i.e., the LEFT TIMING (R1 and R2 with compensation) and the RIGHT TIMING (R1 and R2 without compensation).

FIG. 9 shows an Alternative Method for Determining R1, R2, and D1 for three different DUTs: (1) Case 1: Pogo Pins; (2) Case 2: Switch/Contact; and Case 3: Test Socket (IC Device). The TDR calibration data for each channel determines the location of the DUT (Device Under Test) and where timing de-skew occurs. Drive edges have skewed launches so that the signals arrive synchronized (de-skewed) at the DUT. Receive edges are launched in synchronization from the DUT, but arrive at pin electronics at different times (skewed). They are re-synchronized by comparing at those same different arrival times.

Thus, the following timing works for all three Cases:

$$R1=0 \ s=T0$$

$$D1=\tfrac{1}{2} \ W$$

$$R2=W$$

The reflection of the drive edge is expected to return (receive time) at ½ W because the receive edges are delayed from D1 by the round trip time of the pulse as determined by the sum of the two TDR calibration sets (Tester and Fixture).

The test time overhead is characterized by the following:
Less than 1 ms to program the switch
Less than 5 ms for the switch to actuate and settle
less than 100 ns for the patter file to execute
The test can be executed on every test channel concurrently,
The total test time is well below 10 ms.
The verification test can be performed every test cycle with on significant through put penalty for the highest stands of test.

The Functional Reflectometry Test cannot discriminate between one or both switches being stuck in the on state. However, one the fault is identified, it is easy to use to hand-held multi-meter to make that determination. In the event that a stuck closed fault is detected, it is recommended that both switches in the pair of switches be replaced as:

the most common reason for a stuck closed fault is over-current on either the input (the actuation terminals) of the output side (switched signal); and since all branches of the multiplexing circuit perform the same electrical tests, it is very unlikely that both switches have been similarly stressed and fatigued.

FIG. 10 provide a flowchart of a testing protocol using Functional Reflectometry Test (FRT). To initiate the testing protocol using RFT, both switches are opened (turned off). In the flowchart, FRT is performed a first time. If FRT fails, then one or both switches are stuck closed (on). Thus, the recommended solution is to replace both switches. If FRT passes, then neither switch is stuck closed. Thus, both switches should be tested for proper closed (on) actuation. At this time switch 1 is closed (on).

Now FRT is performed a second time. If FRT fails, then switch 1 is stuck open (off). As a result, switch 1 should be replaced. However, if switch 1 passes the second FRT test, then switch 1 is determined to be functional. Thus, switch 1 is opened (off) and switch 2 is closed (on).

At this point, FRT is performed a third time. If FRT fails, then switch 2 is determined to be stuck open (off). Then, switch 2 should be replaced and the testing protocol re-initiated. However, if FRT passes, then both switches are determined to be fully functional and the testing protocol is ended.

Figure 11:
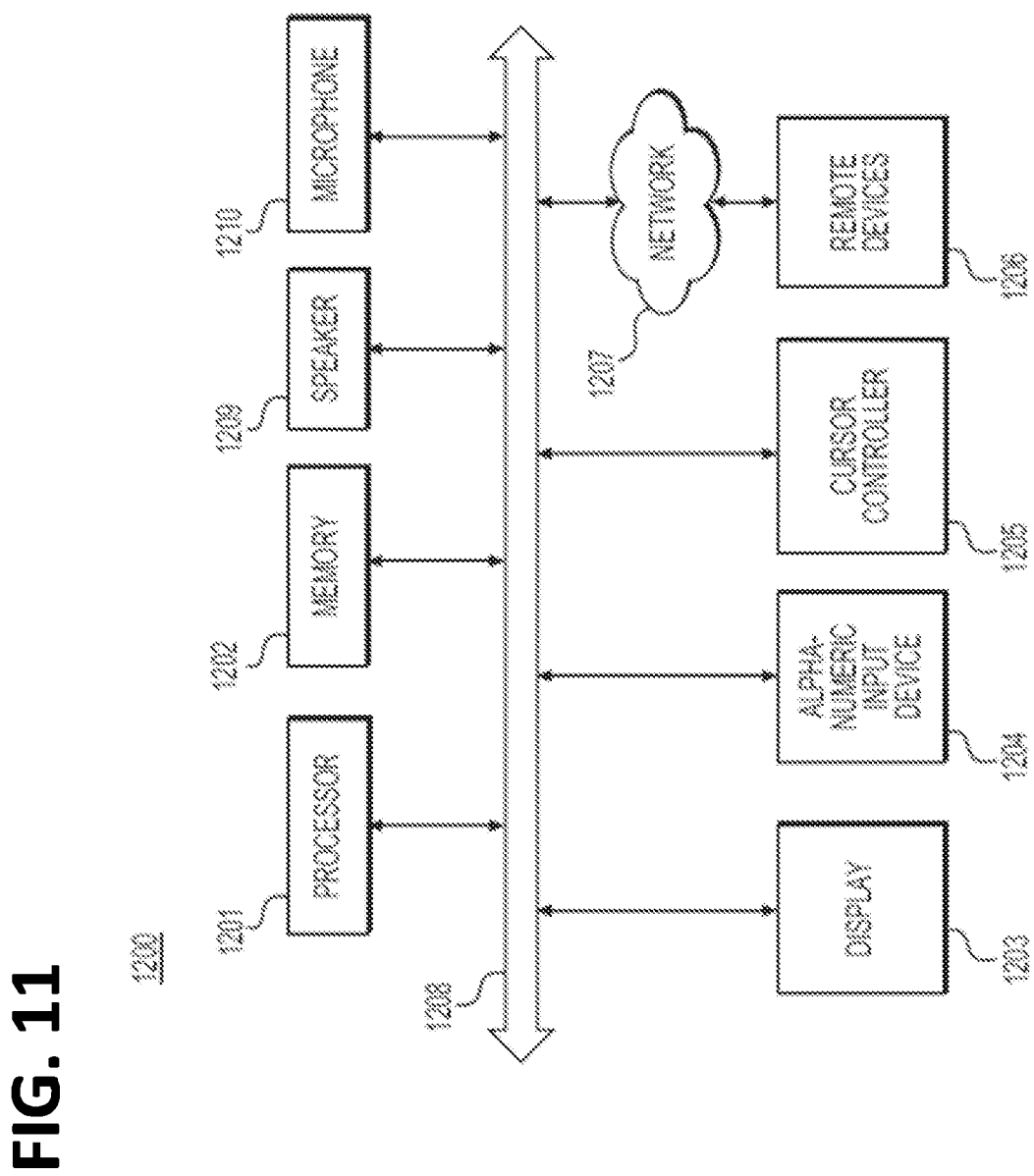
FIG. 11 illustrates an exemplary embodiment of a computer 1200 that may be used in the semiconductor testing process.

FIG. 11 illustrates an exemplary embodiment of a computer 1200 that may be used in the semiconductor testing process that utilizes automated semiconductor test equipment and robotic handlers. The computer 1200 includes one or more sets of computer programming instructions that are stored in memory 1202 and that can be executed by processor 1201 in computer 1200 to perform the process described above. Computer 1200, which when properly programmed with specific testing software, becomes a special purpose computer that is configured for a specialized set of testing operations and functions.

The computer utilized in semiconductor test system may be present in one of many physical configurations, including being configured as a server or as a client terminal. The computer may also be associated with various devices, such as a desk-top computer, a laptop computer, a personal digital assistant, a mobile device, an electronic tablet, a smart phone, etc.

As illustrated in FIG. 11, the computer 1200 includes a processor 1201 and memory 1202, which is representative of one or more various memories that may be used by the computer 1200. These memories may include one or more random access memories, read only memories, and programmable read only memories, etc. Computer 1200 also includes at least one display 1203, which may be provided in any form, including a cathode ray tube, a LED display, an LCD display, and a plasma display, etc. The display may include provisions for data entry, such as by a touch-sensitive screen. Additional output devices may include an audio output device, such as a speaker 1209.

Computer 1200 further includes one or more input devices. Input devices may include one or more of an alpha-numeric input device 1204, such as a keyboard; a cursor controller 1205, such as a mouse, touch-pad, or joy-stick; and a microphone 1210. Computer 1200 also enables processor 1201 to communicate with one or more remote devices 1206 over a network 1207 external to computer 1200. Communications internal to computer 1200 primarily use bus 1208.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Although the invention has been described with reference to several exemplary embodiments, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed; rather the invention extends to all functionally equivalent structures, methods, and uses such as are within the scope of the appended claims.

While the non-transitory computer-readable medium may be shown to be a single medium, the term "computer-readable medium" includes a single medium or multiple media, such as a centralized or distributed database, and/or associated caches and servers that store one or more sets of instructions. The term "non-transitory computer-readable medium" shall also include any medium that is capable of storing, encoding or carrying a set of instructions for execution by a processor, or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. Accordingly, the disclosure is considered to include any computer-readable medium or other equivalents and successor media, in which data or instructions may be stored.

Although the present specification describes components and functions that may be implemented in particular embodiments with reference to particular standards and protocols, the disclosure is not limited to such standards and protocols. For example, standards for Internet and other packet-switched network transmission represent examples of the state of the art. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately-claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for in situ functionality testing of electrical switches using a Functional Reflectometry Test (FRT) of switches on the signal path of electrical circuits in a semiconductor interface, the method comprising:
    initiating the functionality testing of the electrical switches in situ,
    wherein the functionality of the electrical switches is tested while the electrical switches are connected to the Automatic Test Equipment (ATE) and are in-use testing semiconductors; and
    conducting full Functional Reflectometry Testing of the electrical switches in situ in an open switch state and a closed switch state to determine whether each of the electrical switches is one of fully functional, stuck closed, and stuck open,
    wherein testing for each state is performed as a single vector functional test to minimize test time overhead,
    wherein the method uses the Automatic Test Equipment's Time Domain Reflectometry (TDR) calibration program to calibrate out differences in transit times, and
    wherein the Functional Reflectometry Test is performed every test cycle.

2. The method according to claim 1,
    wherein the test can be executed on every test channel concurrently.

3. The method according to claim 1,
    wherein the in situ functionality testing includes connect/disconnect points.

4. The method according to claim 1,
    wherein the in situ functionality testing includes pogo pins.

5. The method according to claim 1,
    wherein the in situ functionality testing includes semiconductor test sockets.

6. The method according to claim 1
    wherein the Functional Reflectometry Test (FRT) creates a timing window within which a reflected edge of a test signal must occur for verification of an open switch state.

7. The method accordingly to claim 6
wherein once the open switch state is verified, then timing data used for the verification of the open switch state is used to verify the closed switch state.
8. The method according to claim 1,
wherein the Functional Reflectometry Test (FRT) looks for expected reflections of test signals at two points in time.
9. The method according to claim 1,
wherein the total test time for the single vector functional test is less than 10 ms.
10. The method according to claim 1, further comprising:
replacing defective electrical switches.
11. A system for performing in situ functionality testing of electrical switches using a Functional Reflectometry Test (FRT), the system comprising:
- electrical switches located on the signal path of electrical circuits in a semiconductor interface;
- a user interface to output test results of the Functional Reflectometry Test (FRT) iu a binary pass or fail format;
- Automatic Test Equipment, including one or more processors and one or more memories, connected to the electrical switches, wherein the one or more processors execute instructions that perform operations, including
  - initiating the functionality testing of the electrical switches in situ, wherein the functionality of the electrical switches is tested while the electrical switches are connected to the Automatic Test Equipment (ATE) and are in-use testing semiconductors;
  - conducting full Functional Reflectometry Testing of the electrical switches in situ in an open switch state and a closed switch state to determine whether each of the electrical switches is one of fully functional, stuck closed, and stuck open, wherein the open switch state and the closed switch state are each performed as a single vector functional test to minimize test time overhead; and
  - executing the Automatic Test Equipment's Time Domain Reflectometry (TDR) calibration program to calibrate out differences in transit times,
  - wherein the Functional Reflectometry Test is performed every test cycle.

12. The system according to claim 11,
wherein the Functional Reflectometry Test (FRT) creates a timing window within which a reflected edge of a test signal must occur for verification of an open switch state.
13. The system accordingly to claim 12,
wherein once the open switch state is verified, then timing data used for the verification of the open switch state is used to verify the closed switch state.
14. The system according to claim 11,
wherein the test can be executed on every test channel concurrently.
15. The system according to claim 11,
wherein the in situ functionality testing includes connect/disconnect points.
16. The system according to claim 11,
wherein the in situ functionality testing includes pogo pins.
17. A non-transitory computer-readable storage medium that stores one or more computer programs, which when executed by the computer, cause the computer to execute operations, including
- initiating the functionality testing of the electrical switches in situ,
- wherein the functionality of the electrical switches is tested while the electrical switches are connected to the Automatic Test Equipment (ATE) and are in-use testing semiconductors;
- conducting full Functional Reflectometry Testing of the electrical switches in situ in an open switch state and a closed switch state to determine whether each of the electrical switches is one of fully functional, stuck closed, and stuck open; and
- executing the Automatic Test Equipment's Time Domain Reflectometry (TDR) calibration program to calibrate out differences in transit times,
- wherein the Functional Reflectometry Test is performed every test cycle, and
- wherein testing for each state is performed as a single vector functional test to minimize test time overhead.

\* \* \* \* \*

UNITED STATES PATENT AND TRADEMARK OFFICE
CERTIFICATE OF CORRECTION

| | |
|---|---|
| PATENT NO. | : 11,555,856 B2 |
| APPLICATION NO. | : 17/280393 |
| DATED | : January 17, 2023 |
| INVENTOR(S) | : Roberts, Jr. et al. |

It is certified that error appears in the above-identified patent and that said Letters Patent is hereby corrected as shown below:

In the Claims

In Column 13, Line 20 (Claim 11), the expression "iu a" should read -- in a --.

Signed and Sealed this
Thirteenth Day of June, 2023

Katherine Kelly Vidal
*Director of the United States Patent and Trademark Office*